United States Patent
Streett et al.

(10) Patent No.: US 9,450,126 B1
(45) Date of Patent: Sep. 20, 2016

(54) SOLAR CELL MODULE

(75) Inventors: Andrew R. Streett, San Clemente, CA (US); Darren S. Cokin, Santa Monica, CA (US); Ray A. Stribling, Redondo Beach, CA (US)

(73) Assignee: THE BOEING COMPANY, Chicago, IL (US)

( * ) Notice: Subject to any disclaimer, the term of this patent is extended or adjusted under 35 U.S.C. 154(b) by 1044 days.

(21) Appl. No.: 12/818,255

(22) Filed: Jun. 18, 2010

(51) Int. Cl.
| | |
|---|---|
| *H01L 31/042* | (2014.01) |
| *H01L 31/0475* | (2014.01) |
| *H01L 31/0392* | (2006.01) |
| *H01L 31/02* | (2006.01) |
| *H01L 31/049* | (2014.01) |

(52) U.S. Cl.
CPC ....... *H01L 31/0475* (2014.12); *H01L 31/0201* (2013.01); *H01L 31/02013* (2013.01); *H01L 31/0392* (2013.01); *H01L 31/042* (2013.01); *H01L 31/049* (2014.12); *Y02E 10/50* (2013.01)

(58) Field of Classification Search
USPC ................................................. 136/243–293
See application file for complete search history.

(56) References Cited

U.S. PATENT DOCUMENTS

| | | | | |
|---|---|---|---|---|
| 3,454,774 | A * | 7/1969 | Wizenick .................. | 136/244 |
| 3,571,915 | A * | 3/1971 | Shirland ....................... | 438/80 |
| 4,133,697 | A * | 1/1979 | Mueller et al. .............. | 136/245 |
| 4,371,739 | A * | 2/1983 | Lewis et al. ................. | 136/251 |
| 4,521,801 | A * | 6/1985 | Kato et al. ................... | 257/748 |
| 5,279,896 | A * | 1/1994 | Tokunaga et al. ..... | 428/355 AC |
| 5,590,495 | A * | 1/1997 | Bressler et al. ............ | 52/173.3 |
| 2010/0212740 | A1* | 8/2010 | Barth et al. .................. | 136/259 |
| 2011/0155203 | A1* | 6/2011 | Funakoshi ............ | H01L 31/048 |
| | | | | 136/244 |

FOREIGN PATENT DOCUMENTS

WO   WO 2009/019940   * 2/2009 ........... H01L 31/042

OTHER PUBLICATIONS

Phylipsen et al., "Environmental life-cycle assessment of multicrystalline silicon solar cell modules", 1995, pp. 1-66.*
Rauschenbach, H.S., Solar Cell Array Design Handbook, Van Nostrand Reinhold Company, Figs. 7-32, 7-33, 7-39 through 7-47, 7-50 through 7-53 (1980).
Wolff, G. et al., "The Flight of FRUSA," Hughes Aircraft Company, El Segundo, AIAA Paper No. 72-510, AIAA 9th Electric Propulsion Conference (1972).
Shibayama, Y. et al., "SFU Solar Array Development Test," Proceedings of the European Space Power Conference, Florence, Italy, pp. 735-740 (1991).
Malone, P.K. et al., "Lightweight Inflatable Solar Array," Journal of Propulsion and Power, vol. 12., No. 5, pp. 866-872 (Sep. 1996-Oct. 1996).

(Continued)

*Primary Examiner* — Thanh-Truc Trinh
(74) *Attorney, Agent, or Firm* — Thompson Hine LLP (57) ABSTRACT

A solar cell module including a substrate and solar cells mounted on the substrate, the substrate including a base layer, a first insulation layer positioned over the base layer, a second insulation layer positioned over the first insulation layer and defining a surface, a first bus bar layer positioned between the first and second insulation layers, the first bus bar layer including at least one bus bar extending across the substrate, and a second bus bar layer positioned over the second insulation layer, the second bus bar layer including bus bars, wherein the solar cells are mounted on the surface and are electrically interconnected by the bus bars of the second bus bar layer.

15 Claims, 8 Drawing Sheets

(56) References Cited

OTHER PUBLICATIONS

Campbell, D. et al., "Development of a Novel, Passively Deployed Roll-Out Solar Array," 2006 IEEE Aerospace Conference, Big Sky, MT, IEEEAC Paper #1646 (Mar. 4-11, 2006).

Clark, C. et al., "Self Deploying, Thin-Film PV Solar Array Structure," 16th Annual/USU Conference on Small Satellites, Logan, UT (Aug. 2002).

Law, D.C. et al., "Lightweight, Flexible, High-Efficiency III-V Multijunction Cells," IEEE (2006).

Lichodziejewski, D. et al., "Inflatable Rigidizable Solar Array for Small Satellites," 44th AIAA/ASME/ASCE/AHS Structures, Structural Dynamics, and Materials Conference, Norfolk, VA (Apr. 7-10, 2003).

Yokota, R., "Recent Trends and Space Applications of Polyimides," Journal of Photopolymer Science and Technology, vol. 12, No. 2, pp. 209-216 (1999).

Küchler, G. et al., "Comed-Flexible Solar Generator," Proc. Seventh European Space Power Conference, Stresa, Italy (May 9-13, 2005).

White, S. et al., "Ultraflex-175 on Space Technology 8 (ST8)—Validating the Next-Generation in Lightweight Solar Arrays," NASA Science Technology Conference, Maryland (2007).

* cited by examiner

SOLAR CELL MODULE

GOVERNMENT CONTRACT

The invention was made with Government support under contract number FA9453-10-C-0206 awarded by the United States Air Force. The Government of the United States has certain rights in this invention.

FIELD

This application relates to solar power systems and, more particularly, to solar cell modules and, even more particularly, to solar cell modules useful in space application.

BACKGROUND

Traditional flexible solar panels are constructed of large sections of solar cells. On occasion, handling loads and/or deployment loads result in stress-induced cracking in the panels. Furthermore, solar cell failures may occur during acceptance testing. Therefore, repair or rework of the solar panels is often necessary.

Thus, large solar panels are commonly constructed from multiple solar cell modules. Therefore, when repair or rework is necessary, only the affected solar cell module or modules may be replaced.

Furthermore, solar panels, including solar panels formed from multiple solar cell modules, require harnessing that collects electrical energy from all of the solar cells in the panel. For example, a solar-powered spacecraft, such as the International Space Station, includes harnessing that brings electrical energy from the solar cells of the panel to the spacecraft. However, due to thermal concerns and stowage factors, the harnessing typically extends along the outer edges of the solar panel. As such, the harnessing may increase the overall size of the solar panel and may create stress concentrations on the solar panel, particularly during deployment (e.g., launch of the spacecraft) and during eclipse thermal cycling.

Accordingly, those skilled in the art continue with research and development efforts in the field of solar power systems.

SUMMARY

In one aspect, the disclosed solar cell module may include a substrate and a plurality of solar cells (e.g., groupings if four cells) mounted on the substrate. The substrate may include a base layer, a first insulation layer positioned over the base layer, a second insulation layer positioned over the first insulation layer and defining a surface, a first bus bar layer positioned between the first and second insulation layers, the first bus bar layer including at least one bus bar extending across the substrate, and a second bus bar layer positioned over the second insulation layer, the second bus bar layer including a plurality of bus bars. The solar cells are mounted on the surface and are electrically interconnected by the bus bars of the second bus bar layer.

In another aspect, the disclosed solar cell module may include a substrate formed as a layered structure including a base layer comprising carbon-filled polyimide (could be any material that is highly emissive and/or electrically conductive and/or atomic oxygen protective), a first insulation layer positioned over the base layer, a second insulation layer positioned over the first insulation layer, the first and second insulation layers comprising polyimide, a first bus bar layer positioned between the first and second insulation layers, the first bus bar layer including a plurality of copper bus bars extending across the substrate, and a second bus bar layer positioned over the second insulation layer, the second bus bar layer including a plurality of bus bars, wherein at least one of the bus bars of the second bus bar layer includes at least two electrical connection points, and a plurality of solar cells mounted on the substrate and electrically interconnected in a series string by the bus bars of the second bus bar layer, wherein the solar cells define at least one junction between adjacent rows of solar cells, and wherein at least one of the electrical connection points is disposed on a first side of the junction and at least another of the electrical connection points is disposed on a second, opposite side of the junction.

Other aspects of the disclosed solar cell module will become apparent from the following description, the accompanying drawings and the appended claims.

DETAILED DESCRIPTION

Figure 1:
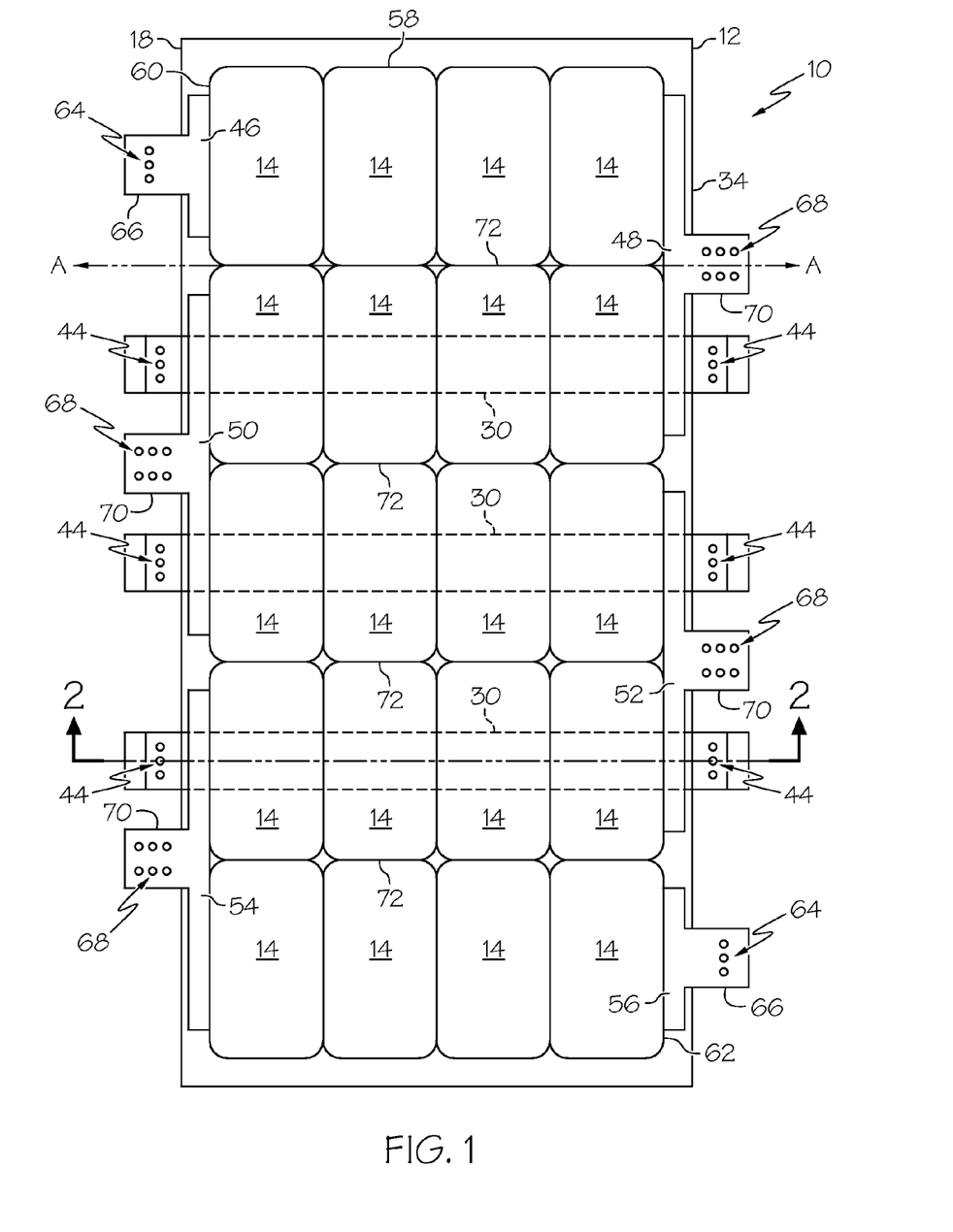
FIG. 1 is a schematic top plan view of one aspect of the disclosed solar cell module.
Figure 2:
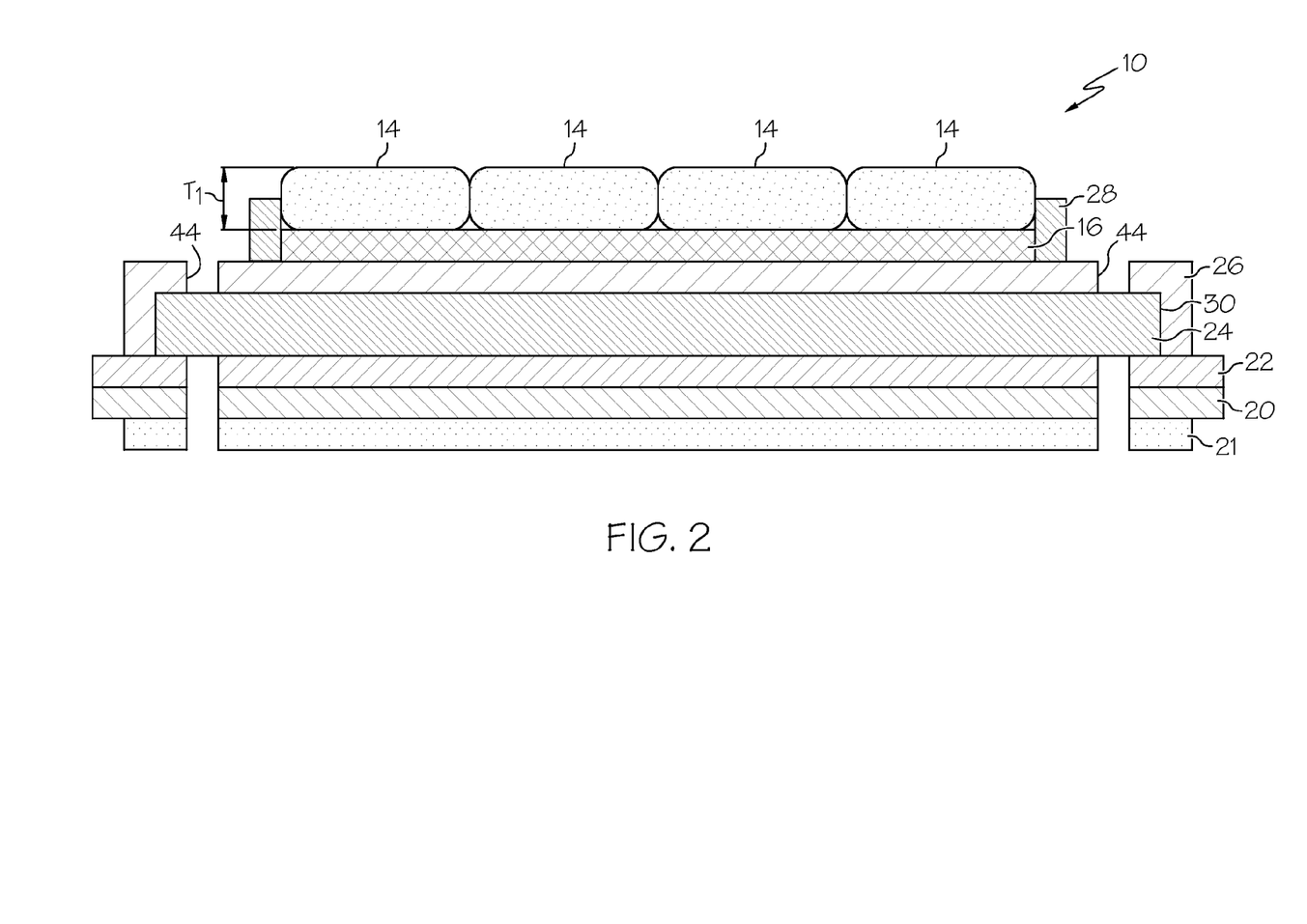
FIG. 2 is a schematic cross-sectional view of the solar cell module of FIG. 1.

Referring to FIGS. 1 and 2, one aspect of the disclosed solar cell module, generally designated 10, may include a substrate 12 and a plurality of solar cells 14 mounted on the substrate 12. Optionally, a layer of adhesive 16, such as silicone adhesive, may be used to secure the solar cells 14 to the substrate 12.

FIG. 1 shows twenty solar cells 14 arranged in series in a serpentine pattern extending from the top left of FIG. 1 to the bottom right. However, those skilled in the art will appreciate that any number of solar cells 14, whether fewer than twenty or more than twenty, may be used without departing from the scope of the present disclosure. Furthermore, those skilled in the art will appreciate that the solar cells 14 may be electrically configured in various ways other than in series in a serpentine pattern. For example, the solar cells 14 may be alternatively arranged in parallel. As another example, the solar cells 14 may be alternatively arranged in series and in parallel.

The solar cells 14 may be any apparatus that convert solar radiation energy into electrical energy. As one example, the solar cells 14 may be silicon-based solar cells. As another example, the solar cells 14 may be high efficiency multi junction solar cells, such as gallium arsenide ("GaAs") solar cells or inverted metamorphic ("IMM") solar cells. Those skilled in the art will appreciate that combinations of two or more different types of solar cells 14 may be used on a single solar cell module 10 without departing from the scope of the present disclosure.

In one particular implementation, the solar cell module 10 may be flexible. For example, the disclosed solar cell module 10 may be capable of being rolled around a drum having a diameter of 10 inches, possibly even 4 inches or less, without damaging the components of the solar cell module 10. As such, the solar cells 14 of the solar cell module 10 may be thin, high efficiency solar cells capable of providing such flexibility. For example, the thin solar cells 14 may have a cross-sectional thickness $T_1$ (FIG. 2) of at most about 100 microns, such as at most about 50 or at most about 15 microns.

Figure 3:
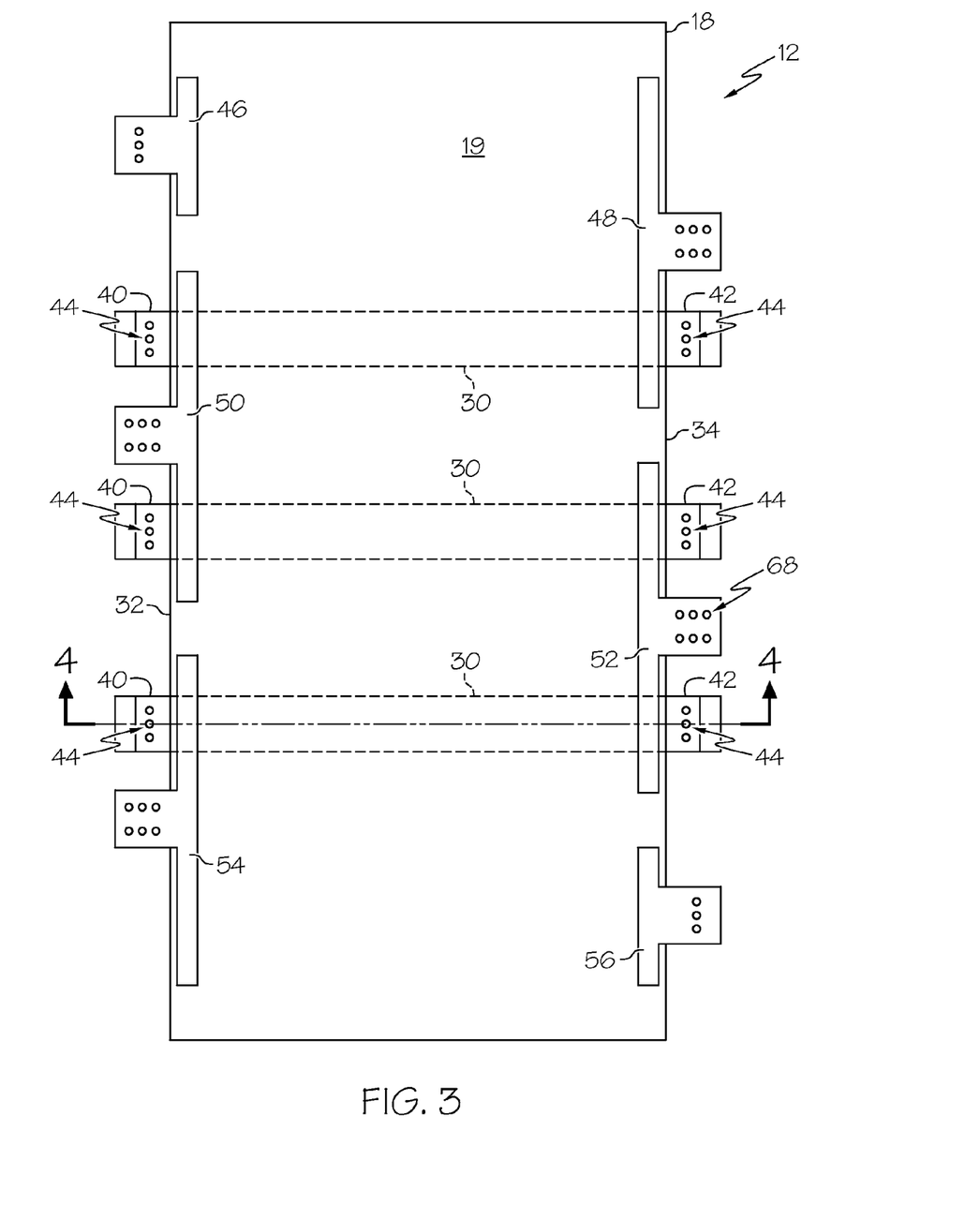
FIG. 3 is a schematic top plan view of the substrate of the solar cell module of FIG. 1.
Figure 4:
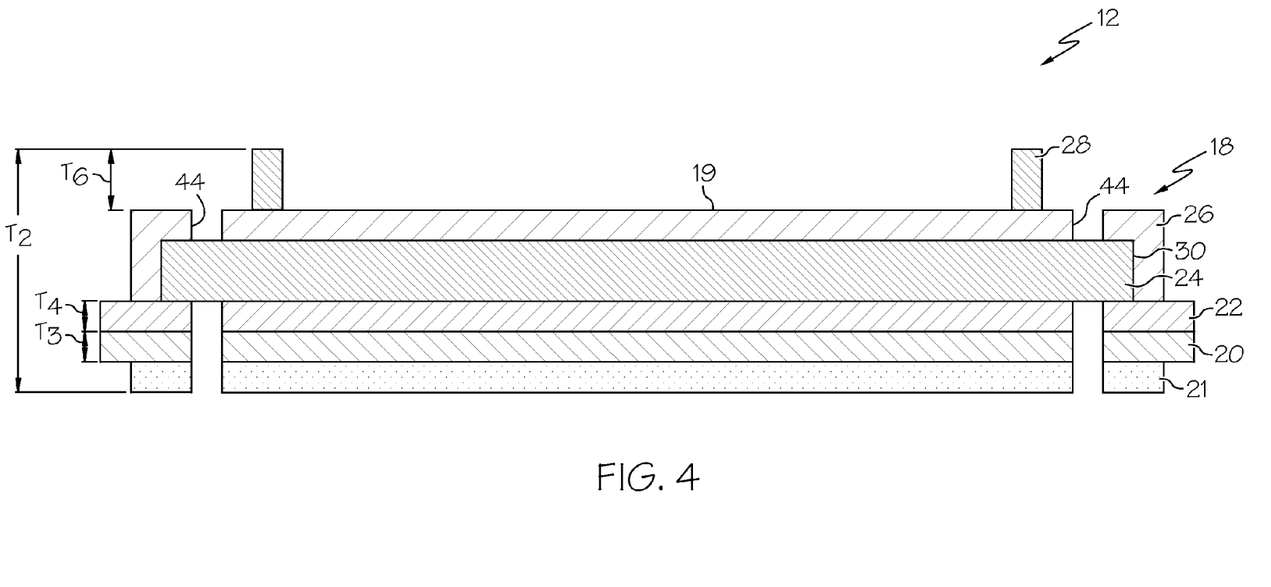
FIG. 4 is a schematic cross-sectional view of the substrate of FIG. 3.

Referring to FIGS. 3 and 4, the substrate 12 of the disclosed solar cell module 10 may be formed as a layered structure 18 having a solar cell receiving surface 19. The layered structure 18 may include a base layer 20, a first insulation layer 22, a first bus bar layer 24, a second insulation layer 26 and a second bus bar layer 28. Optionally, the layered structure 18 may also include a foam layer 21 below the base layer 20. Additional layers, such as one or more additional bus bar layers and one or more additional insulation layers, may also be included without departing from the scope of the present disclosure.

The layered structure 18 may be laminated. However, other techniques for connecting the layers 20, 21, 22, 24, 26, 28, such as use of adhesives, are also contemplated.

The layered structure 18 may be relatively thin and flexible. In one expression, the total cross-sectional thickness $T_2$ of the layered structure 18 may range from 1 to 100 mils (0.001 to 0.1 inches). In another expression, the total cross-sectional thickness $T_2$ of the layered structure 18 may range from 2 to 20 mils (0.002 to 0.02 inches). In yet another expression, the total cross-sectional thickness $T_2$ of the layered structure 18 may range from 5 to 10 mils (0.005 to 0.01 inches).

In one particular aspect, the materials forming the various layers 20, 21, 22, 24, 26, 28 of the substrate 12 of the solar cell module 10 may be selected to avoid mismatch in the coefficients of thermal expansion between the layers. In one specific expression, the materials forming the various layers 20, 21, 22, 24, 26, 28 of the substrate 12 may be selected to provide a mismatch in the coefficients of thermal expansion between any two layers of at most 50 percent. In another specific expression, the materials forming the various layers 20, 21, 22, 24, 26, 28 of the substrate 12 may be selected to provide a mismatch in the coefficients of thermal expansion between any two layers of at most 5 percent. In yet another specific expression, the materials forming the various layers 20, 21, 22, 24, 26, 28 of the substrate 12 may be selected to provide a mismatch in the coefficients of thermal expansion between any two layers of at most 1 percent.

The foam layer 21 may be used to minimize vibration and acoustic loads in the solar cell module 10. In one implementation, the foam layer 21 may include an open-cell foam, such as a polyimide foam. An example of suitable material for the foam layer 21 is SOLIMIDE® polyimide foam available from Evonik Foams, Inc. of Allen, Tex.

The base layer 20 of the substrate 12 may provide the solar cell module 10 with high thermal emissivity and electrostatic discharge ("ESD") protection. Specifically, the base layer 20 of the substrate 12 may be multifunctional in that the base layer 20 may be highly emissive and electrically conductive. In one particular expression, the base layer 10 of the substrate 12 may have an emissivity of at least 0.75, such as 0.85 or more, to provide the solar cell module 10 with thermal emissivity, and a surface resistivity ranging from 1 to 1,000,000 Ohms/sq, such as at most 400 Ohms/sq, to provide the solar cell module 10 with ESD dissipation capabilities.

In one specific implementation, the base layer 20 may be formed from or may include a carbon-filled polyimide. Carbon-filled polyimide may be prepared by dispersing conductive carbon particles in a polyimide matrix. A specific example of a useful carbon-filled polyimide for the base layer 20 is KAPTON® XC polyimide film available from E. I. du Pont de Nemours and Company of Wilmington, Del. KAPTON® XC polyimide film is highly emissive, electrically conductive and has a cross-sectional thickness $T_3$ of about 1 mil (0.001 inches) (could also be 2 mil or 5 mil as standard products). Those skilled in the art will appreciate that the cross-sectional thickness $T_3$ of base layer 20 may depend on the type of material used and may be sufficiently thick to achieve the required emissivity, electrical conductivity and structural properties. Furthermore, KAPTON® XC polyimide film has a coefficient of thermal expansion that is closely matched to the coefficients of thermal expansion of a material like KAPTON® E, which is discussed below in connection with the first 22 and second 26 insulation layers, and copper, which is discussed below in connection with the first bus bar layer 24 and the second bus bar layer 28.

In an alternative implementation, the base layer 20 may be applied to the substrate 12 as a coating (as opposed to a film). For example, the base layer 20 may be spray-coated, vapor deposited, sputtered or the like onto the substrate 12.

Optionally, the base layer 20 of the substrate 12 may also provide the solar cell module 10 with atomic oxygen protection. Atomic oxygen protection may be particularly advantageous when the solar cell module 10 is deployed in extraterrestrial applications, such as in low earth orbit. Alternatively, an additional layer (not shown) may be applied to the base layer 20, such as by coating the base layer 20, to provide the solar cell module 10 with atomic oxygen protection. For example, an oxide, such as indium-tin oxide (or another flexible oxide technology), may be incorporated into the base layer 20 or coated onto the base layer 20 to provide the solar cell module 10 with atomic oxygen protection.

The first insulation layer 22 may electrically insulate the base layer 20 from the first bus bar layer 24. While those skilled in the art will appreciate that various insulative materials may be used to form the first insulation layer 22, in one particular implementation, the first insulation layer 22 may be formed from or may include a polyimide. A specific example of a useful polyimide for the first insulation layer 22 is KAPTON® E polyimide film available from E. I. du Pont de Nemours and Company of Wilmington, Del. KAPTON® E polyimide film is highly insulative and has a cross-sectional thickness $T_4$ of about 1 mil (0.001 inches), though 2 mil and 5 mil are also available standard depending on appropriate dielectric strength need and environmental effects to protect against. Those skilled in the art will appreciate that the cross-sectional thickness $T_4$ of the first insulation layer 22 may depend on the insulative material used and may be sufficiently thick to provide the required electrical insulation.

Figure 5:
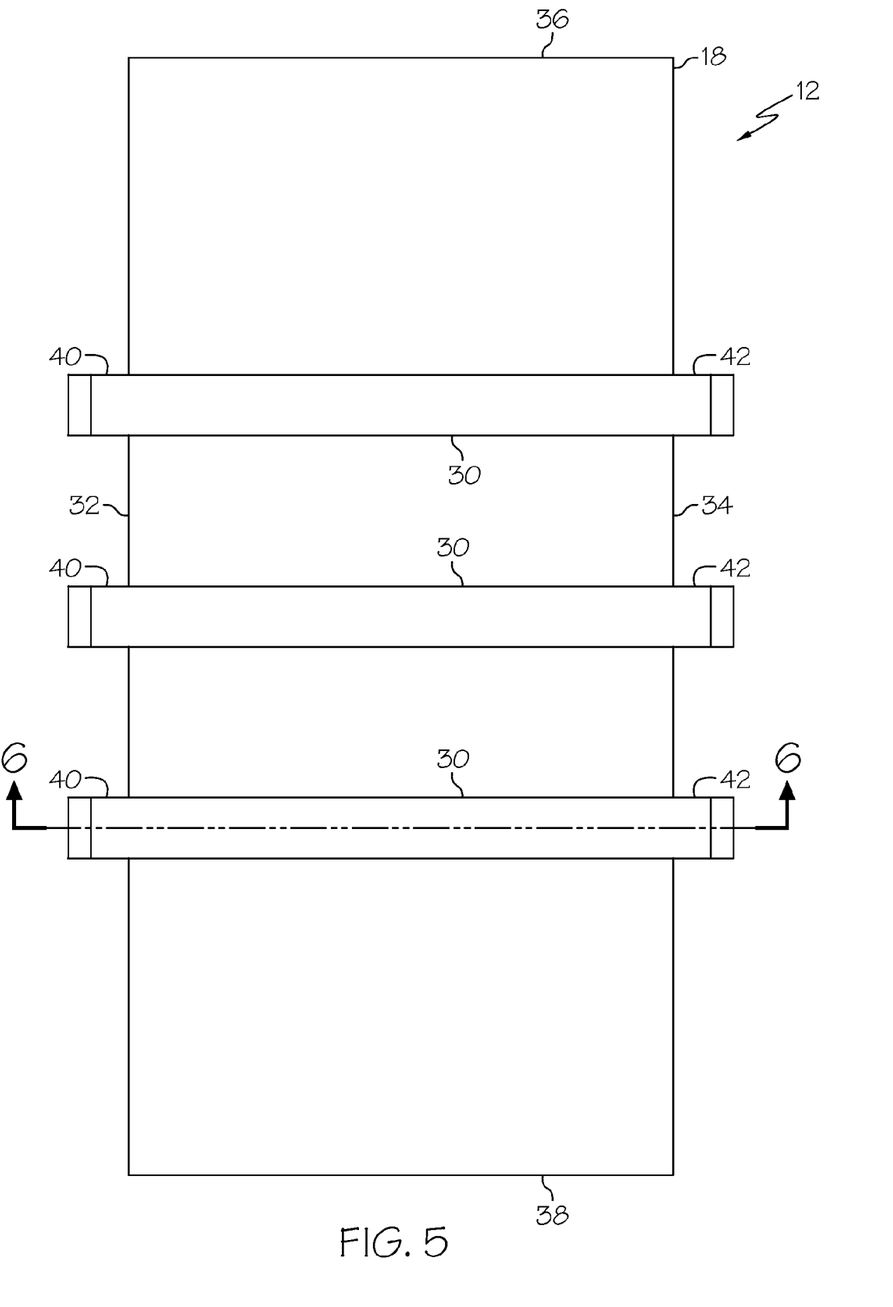
FIG. 5 is a schematic top plan view of the substrate of FIG. 3 shown only partially assembled.
Figure 6:
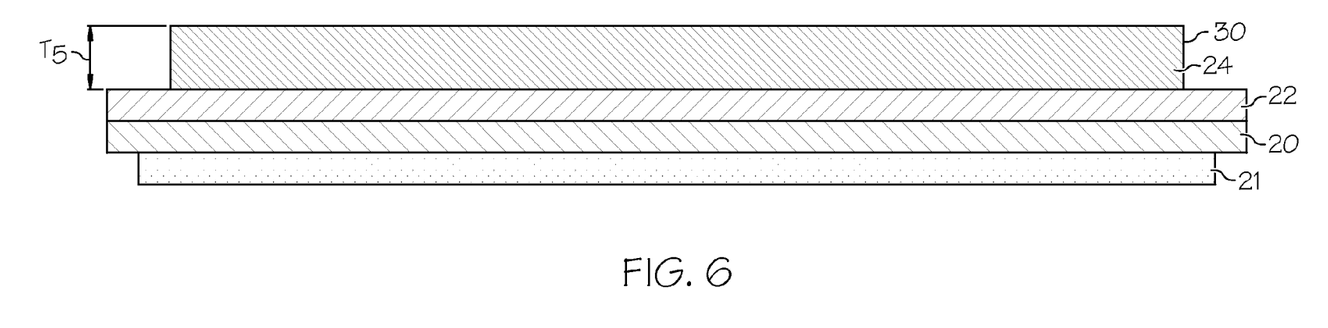
FIG. 6 is a schematic cross-sectional view of the partially assembled substrate of FIG. 5

Referring to FIGS. 5 and 6, the first bus bar layer 24 may include one or more bus bars 30 layered over the first insulation layer 22 and extending across the layered structure 18. The bus bars 30 may extend from a first edge 32 of the layered structure 18 to a second, opposite edge 34 of the layered structure 18.

The first bus bar layer 24 may be generally flat. Alternatively, the first bus bar layer 24 could be non-flat and/or in-plane stress relieved. Also, the first bus bar layer 24 could be serpentined for additional stress relief.

As shown in FIG. 5, in one specific expression, the layered structure 18 may be generally rectangular in top view (e.g., 6 inches by 13 inches) and may include the first 32 and second 34 edges (e.g., longitudinal edges) and transverse edges 36, 38. The bus bars 30 may be generally parallel with at least one edge 32, 34, 36, 38 (e.g., the transverse edges 36, 38) of the layered structure 18. In other expressions, the layered structure 18 may have various shapes and configurations in top view.

Optionally, each bus bar 30 may include first 40 and second 42 connection portions (e.g., tabs) that extend outward from the first 32 and second 34 edges of the layered structure 18 to facilitate electrically coupling the bus bars 30 of solar cell module 10 to the bus bars (not shown) of adjacent solar cell modules (not shown). The first insulation layer 22 may extend beyond the connection portions 40, 42 to ensure electrical isolation of the bus bars 30 from the base layer 20.

The bus bars 30 of the first bus bar layer 24 may be formed from an electrically conductive material, such as a metal (e.g., copper). As a specific example, the bus bars 30 may be formed from or may include copper having a cross-sectional thickness $T_5$ of about 1.4 mils (0.0014 inches). Those skilled in the art will appreciate that the cross-sectional thickness $T_5$ of the bus bars 30 of the first bus bar layer 24 may depend on the conductive material used and may be sufficiently thick to handle the electrical current generated by multiple solar cell modules (e.g., the entire array).

Referring back to FIGS. 3 and 4, the second insulation layer 26 may electrically insulate the first bus bar layer 24 from the second bus bar layer 28. The second insulation layer 26 may include the same or similar material (e.g., KAPTON® E polyimide film) used in the first insulation layer 22 and may have the same or similar cross-sectional thickness (e.g., 1 mil) as the first insulation layer 22.

The second insulation layer 26 may define a plurality of recesses 44 extending therethrough to provide electrical access to the underlying first bus bar layer 24. In one implementation, at least one such recess 44 may be associated with each of the first and second connection portions 40, 42 of the bus bars 30. Thus, the recesses 44 may define electrical connection points (e.g., open-conductive patches) for electrically coupling the bus bars 30 of the solar cell module 10 to the bus bars of adjacent solar cell modules.

The foam layer 21, the base layer 20 and/or the first insulation layer 22 may also include recesses similar to recesses 44 of the second insulation layer 26 to facilitate making electrical contact with the first bus bar layer 24.

The second bus bar layer 28 may include a plurality of bus bars 46, 48, 50, 52, 54, 56 positioned over the second insulation layer 26. The bus bars 46, 48, 50, 52, 54, 56 may extend along the first 32 and second 34 edges of the layered structure 18.

The bus bars 46, 48, 50, 52, 54, 56 of the second bus bar layer 28 may be formed from an electrically conductive material, such as a metal (e.g., copper). As a specific example, the bus bars 46, 48, 50, 52, 54, 56 may be formed from or may include copper having a cross-sectional thickness $T_6$ of about 1.4 mils (0.0014 inches). Those skilled in the art will appreciate that the cross-sectional thickness $T_6$ of the bus bars 46, 48, 50, 52, 54, 56 may depend on the conductive material used and may have a sufficient cross-sectional thickness to handle the electrical current generated by the solar cells 14.

As shown in FIG. 1, the bus bars 46, 48, 50, 52, 54, 56 may electrically interconnect the solar cells 14 into a series string 58, such as a serpentine series string. Specifically, the bus bars 46, 48, 50, 52, 54, 56 may electrically interconnect adjacent rows of solar cells 14 into the series string 58. For example, bus bar 46 may define a first end 60 of the series string 58 of solar cells 14, bus bar 48 may electrically coupled a first row of solar cells 14 to a second row of solar cells 14, bus bar 50 may electrically coupled the second row of solar cells 14 to a third row of solar cells 14, bus bar 52 may electrically coupled the third row of solar cells 14 to a fourth row of solar cells 14, bus bar 54 may electrically coupled the fourth row of solar cells 14 to a fifth row of solar cells 14, and bus bar 56 may define a second end 62 of the series string 58 of solar cells 14.

The bus bars 46, 56 disposed at the ends 60, 62 of the series string 58 may include one or more electrical connection points 64. The electrical connection points 64 may include any feature or structure that facilitates making an electrical connection to the bus bars 46, 56 at the electrical connection points 64. For example, the electrical connection points 64 may be recesses in one or more of the layers of the layered structure 18 that define open-conductive patches (e.g., open-copper), similar to the recesses 44 associated with the first bus bar layer 24. Therefore, the electrical connection points 64 may facilitate electrically coupling the solar cell module 10 to other solar cell modules.

In one specific expression, the bus bars 46, 56 disposed at the ends 60, 62 of the series string 58 may include tabs 66 projecting outward from the bus bars 46, 56. The electrical connection points 64 may be disposed on the tabs 66 to make the electrical connection points 64 more accessible. While the tabs 66 are shown and described as being extensions of the bus bars 46, 56, those skilled in the art will appreciate that the tabs 66 may be a part of the overall layered structure 18 and/or may be urged (e.g., bent) to conform with the confines (e.g., rectangular confines) of the overall substrate 12.

Bus bars 48, 50, 52, 54 may each include at least two electrical connection points 68, such as a pair of electrical connection points 68. Specifically, each bus bar 48, 50, 52, 54 may include at least two electrical connection points 68 aligned with the junction 72 between adjacent rows of cells 14 being electrically coupled by the associated bus bar 48, 50, 52, 54. At least one of the electrical connection points 68 may be disposed on a first side of the junction 72 and at least one other electrical connection point 68 may be disposed on the second, opposite side of the junction 72.

The electrical connection points 68 may include any feature or structure (e.g., open-metal patches) that facilitates making electrical connections to the bus bars 48, 50, 52, 54 at the electrical connection points 68.

Figure 7:
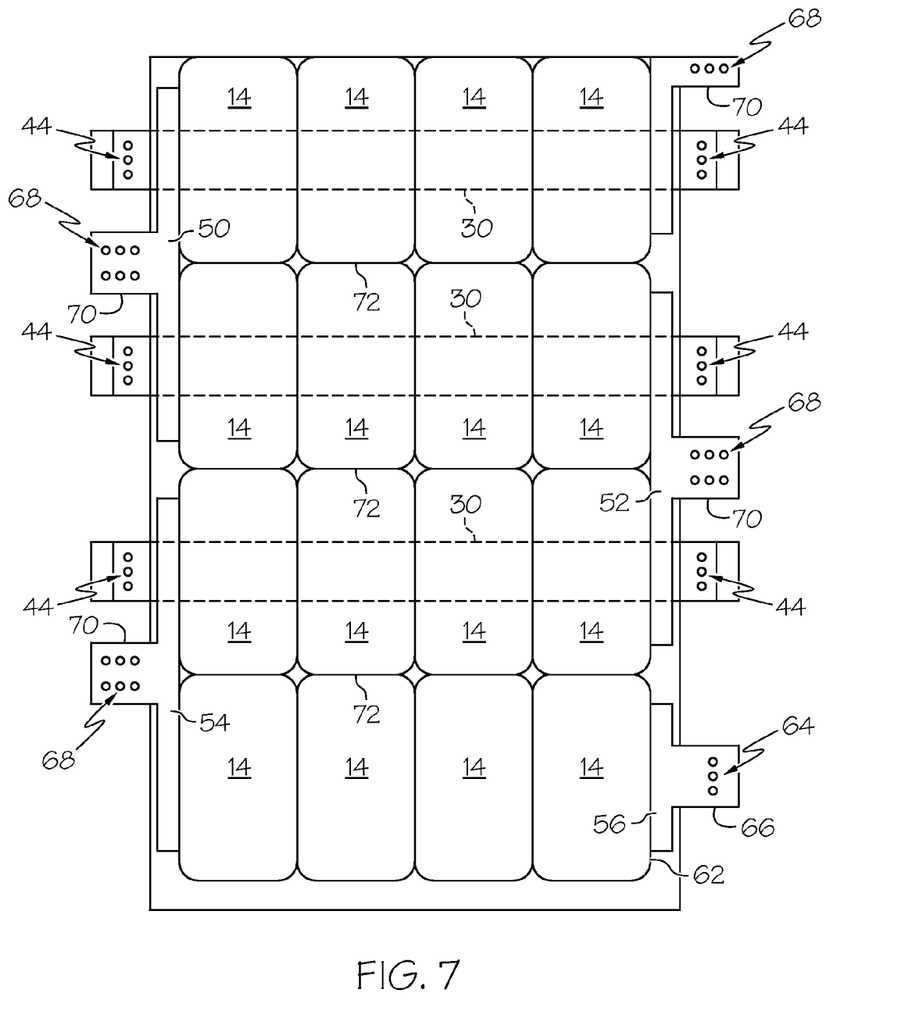
FIG. 7 is schematic top plan view of the solar cell module of FIG. 1 with a section of solar cells removed therefrom.
Figure 8:
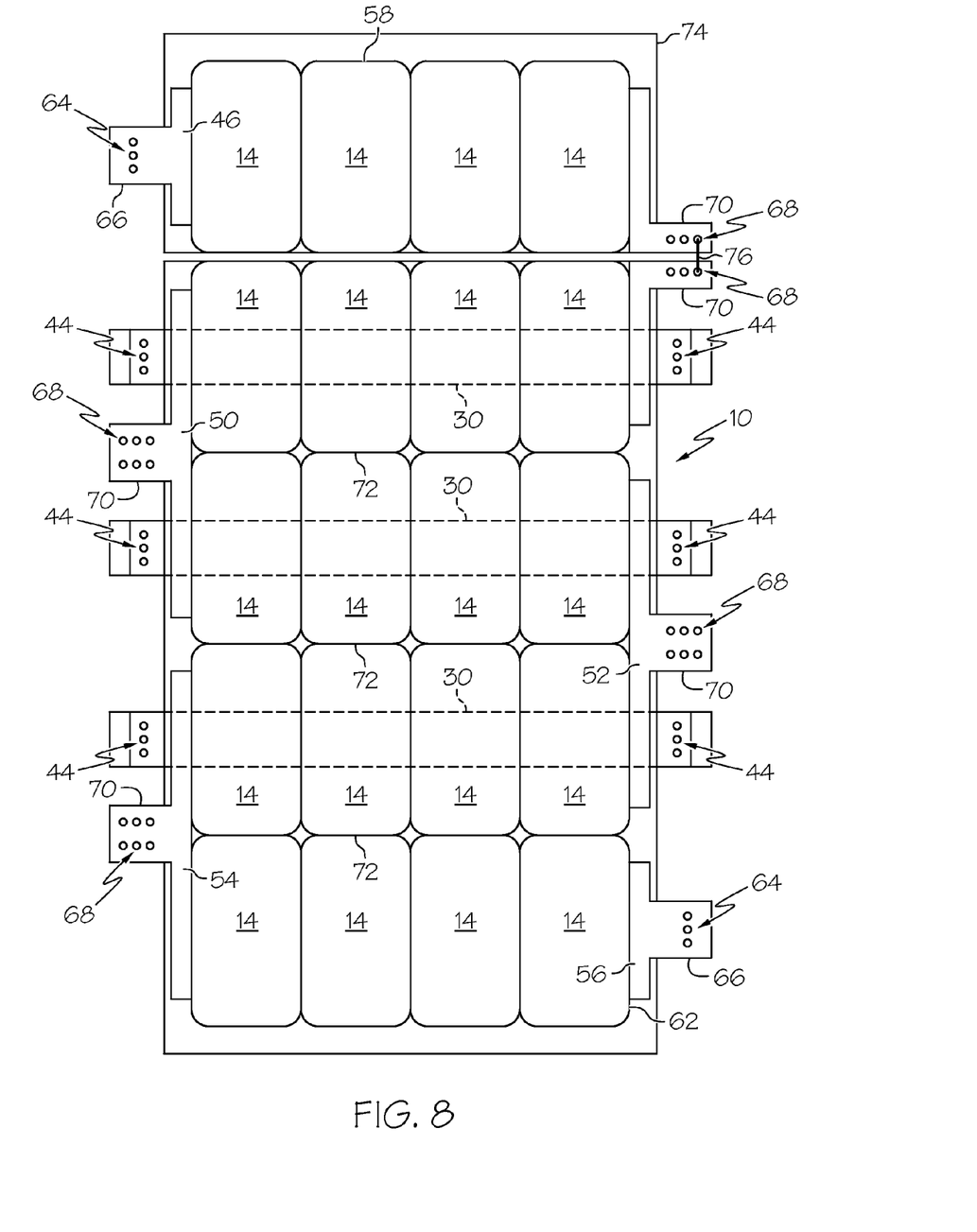
FIG. 8 is schematic top plan view of the solar cell module of FIG. 7 with a replacement section of solar cells connected thereto.

In one specific expression, the bus bars 48, 50, 52, 54 may include tabs 70 projecting outward therefrom. The tabs 70 may define a centerline that may be aligned with the junctions 72 between adjacent rows of cells 14. Each tab 70 may include at least two of the electrical connection points 68, thereby making the electrical connection points 68 more accessible to facilitate repairability, as shown in FIGS. 7 and 8. While the tabs 70 are shown and described as being extensions of the bus bars 48, 50, 52, 54, those skilled in the art will appreciate that the tabs 70 may also be a part of the overall layered structure 18.

The electrical connection points 68 of the bus bars 48, 50, 52, 54 may facilitate electrically coupling replacement sections to the solar cell module 10. For example, as shown in FIGS. 1 and 7, a section of the solar cell module 10, such as a section that includes one or more damaged solar cells 14 (e.g., four cells), may be removed by cutting through the solar cell module 10 along line A-A, which may extend along the junction 72 between two rows of solar cells 14. Then, as shown in FIG. 8, a replacement section 74, which may be generally structurally similar to the removed section, may be electrically coupled and mechanically coupled (e.g., with tape) to the solar cell module 10 using an electrical connection 76 that extends from one or more of the electrical connection points 68 of the replacement section 74 to one or more corresponding electrical connection points 68 of the original solar cell module 10.

At this point, those skilled in the art will appreciate that the number of electrical connection points 68 used to make the electrical connection 76 may depend on the electrical connection technique used. For example, the electrical connection 76 may be made by solder, laser weld, ultrasonic weld, parallel gap weld and/or resistance weld. The unused electrical connection points 68, if any, may be reserved for connecting subsequent replacement sections in the future.

Accordingly, the disclosed solar cell module 10 may be flexible. As such, the disclosed solar cell module 10 may be highly stowable, thereby facilitating rolled or folded array designs. Furthermore, the disclosed solar cell module 10 may be highly scalable. As such, multiple solar cell modules 10 may be arranged to form panels of various voltages and currents, as desired. Still furthermore, the disclosed solar cell module 10 may improve the process of repairing and reworking solar panels and solar arrays, which may significantly reduce maintenance costs as higher efficiency/higher cost solar cells are integrated into large solar arrays. Specifically, repair or rework of a solar panel or a solar array may be performed at the panel level, at the solar cell module level or, as described above, within a solar cell module.

Furthermore, by integrating the bus bars 30 into the substrate 12 of the solar cell module 10, several advantages may be achieved. First, the overall size of the solar cell module 10 and, hence, the resulting panel may be reduced. Second, the bus bars 30, being positioned behind the solar cells 14, may provide radiation shielding to the solar cells 14. Additional advantages may also be achieved. This provides modularity and an easy manufacturing plan for just one substrate.

Although various aspects of the disclosed solar cell module have been shown and described, modifications may occur to those skilled in the art upon reading the specification. The present application includes such modifications and is limited only by the scope of the claims.

What is claimed is:

1. An individual solar cell module comprising:
    a substrate formed as a layered structure, the substrate including:
        a base layer;
        a first insulation layer positioned over said base layer;
        a second insulation layer positioned over said first insulation layer;
        a first bus bar layer positioned between said first insulation layer and said second insulation layer, said first bus bar layer including at least one bus bar extending across said first insulation layer and beneath said second insulation layer, wherein said at least one bus bar is configured to electrically couple said individual solar cell module to adjacent individual solar cell modules;
        a second bus bar layer positioned over said second insulation layer and being insulated from said first bus bar layer by said second insulation layer, said second bus bar layer including a plurality of bus bars, wherein at least one bus bar of said plurality of bus bars of said second bus bar layer includes at least one tab projecting outward therefrom and said at least one tab has at least two electrical connection points arranged over a center line of said at least one tab, at least one electrical connection point of said at least two electrical connection points being disposed on a first side of said center line and at least another electrical connection point of said at least two electrical connection points disposed on an opposite side of said center line; and
    a plurality of solar cells mounted on said substrate and electrically interconnected to one another in series and in a serpentine pattern by said plurality of bus bars of said second bus bar layer, said second bus bar layer being electrically insulated from said first bus bar layer within said individual solar cell module by said second insulation layer, wherein said plurality of solar cells define at least one junction between rows of solar cells of said plurality of solar cells, said at least one junction being aligned with said center line of said at least one tab of said at least one bus bar of said plurality of bus bars of said second bus bar layer such that at least one damaged row of said plurality of solar cells and a corresponding at least one tab with said at least two connection points are configured to be cut and divided at said junction and said center line of said corresponding at least one tab, and at least one remaining electrical connection point of said at least two connection points of said corresponding at least one tab is configured to electrically connect to at least one connection point of at least one tab of a replacement of said damaged row of said plurality of solar cells.

2. The individual solar cell module of claim 1 wherein said layered structure has a cross-sectional thickness of at most 50 mils.

3. The individual solar cell module of claim 1 wherein said base layer has an emissivity ranging from about 0.75 to about 1.0, and a surface resistivity ranging from about 1 to about 1,000,000 Ohms/sq.

4. The individual solar cell module of claim 1 wherein said base layer has an emissivity of at least 0.85 and a surface resistivity of at most 400 Ohms/sq.

5. The individual solar cell module of claim 1 wherein said base layer comprises carbon-filled polyimide.

6. The individual solar cell module of claim 1 further comprising an atomic oxygen protectant coated onto or incorporated into the base layer.

7. The individual solar cell module of claim 6 wherein said atomic oxygen protectant comprises an oxide.

8. The individual solar cell module of claim 1 wherein at least one of said first insulation layer and said second insulation layer comprises polyimide.

9. The individual solar cell module of claim 1 wherein said substrate further comprises a foam layer adjacent to said base layer.

10. The individual solar cell module of claim 1 wherein at least one of said first bus bar layer and said second bus bar layer comprises copper.

11. The individual solar cell module of claim 1 wherein said at least one bus bar of said first bus bar layer comprises a first end having at least one electrical connection point disposed proximate said first end and a second, opposite end having at least one electrical connection point disposed proximate said second end, said first end and said second end electrically connecting said at least one bus bar to corresponding bus bars of said adjacent individual solar cell modules.

12. The individual solar cell module of claim 11 wherein said electrical connection point disposed proximate said first end is defined by a recess in at least one of said first insulation layer and said second insulation layer.

13. The individual solar cell module of claim 1 wherein each of said electrical connection points comprises an open-conductive patch.

14. The individual solar cell module of claim 1 capable of being wrapped around a drum without damaging said substrate and said plurality of solar cells, said drum having a diameter of 8 inches.

15. A solar panel comprising a plurality of the individual solar cell modules of claim 1.

* * * * *